US008203166B2

(12) United States Patent
Chin

(10) Patent No.: US 8,203,166 B2
(45) Date of Patent: Jun. 19, 2012

(54) LIGHT EMITTING DIODE MODULE

(75) Inventor: Wen-Chung Chin, Shulin (TW)

(73) Assignee: Shin Zu Shing Co., Ltd., Taipei Hsien (TW)

( * ) Notice: Subject to any disclaimer, the term of this patent is extended or adjusted under 35 U.S.C. 154(b) by 180 days.

(21) Appl. No.: 12/819,488

(22) Filed: Jun. 21, 2010

(65) Prior Publication Data

US 2011/0309401 A1 Dec. 22, 2011

(51) Int. Cl.
*H01L 33/36* (2010.01)

(52) U.S. Cl. .................. 257/99; 257/730; 257/E33.066; 361/792

(58) Field of Classification Search ................... 257/730
See application file for complete search history.

(56) References Cited

U.S. PATENT DOCUMENTS 7,944,708 B2 * 5/2011 Lin .............................. 361/785
7,946,727 B2 * 5/2011 Lee .......................... 362/249.06
2008/0170396 A1 * 7/2008 Yuan et al. .................... 362/244
2010/0289041 A1 * 11/2010 Shakuda ......................... 257/93
2010/0314655 A1 * 12/2010 Thompson ...................... 257/99

* cited by examiner

*Primary Examiner* — Stephen W Smoot
(74) *Attorney, Agent, or Firm* — Apex Juris, pllc; Tracy M. Heims

(57) ABSTRACT

A light emitting diode (LED) module has a hexagonal substrate and at least one LED mounted on the substrate. The substrate may have three terminal sets and three sockets. Each terminal set of one LED module has a positive terminal and a negative terminal plugged respectively to a positive jack and a negative jack of each socket of the other LED module. The substrate may have six terminal sets. Each terminal set of one LED module has a positive terminal and a negative terminal respectively connected to the positive and negative terminals of each set of the other LED module through connectors. The LED modules are connected in parallel and the hexagonal substrate allows the LED modules to be arranged in different patterns according to variable products. Moreover, replacing the LED module with a new one is easy, low cost and saves resources.

6 Claims, 5 Drawing Sheets

LIGHT EMITTING DIODE MODULE

BACKGROUND OF THE INVENTION

1. Field of the Invention

The present invention relates to a light emitting diode (LED) module, especially to an LED module having a hexagonal substrate.

2. Description of the Prior Art(s)

A light emitting diode (LED) module is a light emitting device and is used on product, such as street lamp, car lamp or the like, that needs light or is used as backlight of a monitor. A conventional LED module has a substrate and multiple LEDs. The substrate is a printed circuit board and has a circuit formed on the substrate. The LEDs are mounted on the substrate and are soldered to the circuit so the LEDs are electrically connected to the circuit of the substrate. The amount of the LEDs is adjustable according to the variable products that have different brightness.

Since the substrate of the conventional LED module is shaped corresponding to the product, to assemble the conventional LED module in the product is convenient and time saving. However, now that the LEDs are soldered to the circuit, when some of the LEDs break, replacement is difficult. The only way to keep the brightness of the conventional LED module is to replace the whole conventional LED module with a new one. Thus, not only is replacing the conventional LED module with a new one expensive, but also wasteful.

To overcome the shortcomings, the present invention provides an LED module to mitigate or obviate the aforementioned problems.

SUMMARY OF THE INVENTION

The main objective of the present invention is to provide a light emitting diode (LED) module. The LED module has a hexagonal substrate and at least one LED mounted on the substrate.

The substrate may have three terminal sets and three sockets. Each terminal set of one LED module has a positive terminal and a negative terminal plugged respectively to a positive jack and a negative jack of each socket of the other LED module.

The substrate may have six terminal sets. Each terminal set of one LED module has a positive terminal and a negative terminal respectively connected to the positive and negative terminals of each set of the other LED module.

The LED modules are connected in parallel and the hexagonal substrate allows the LED modules to be arranged in different patterns according to variable products. When the at least one LED breaks down, only the LED module having the at least one broken LED needs to be replaced. Therefore, replacing the LED module with a new one is easy, low cost and saves resources.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
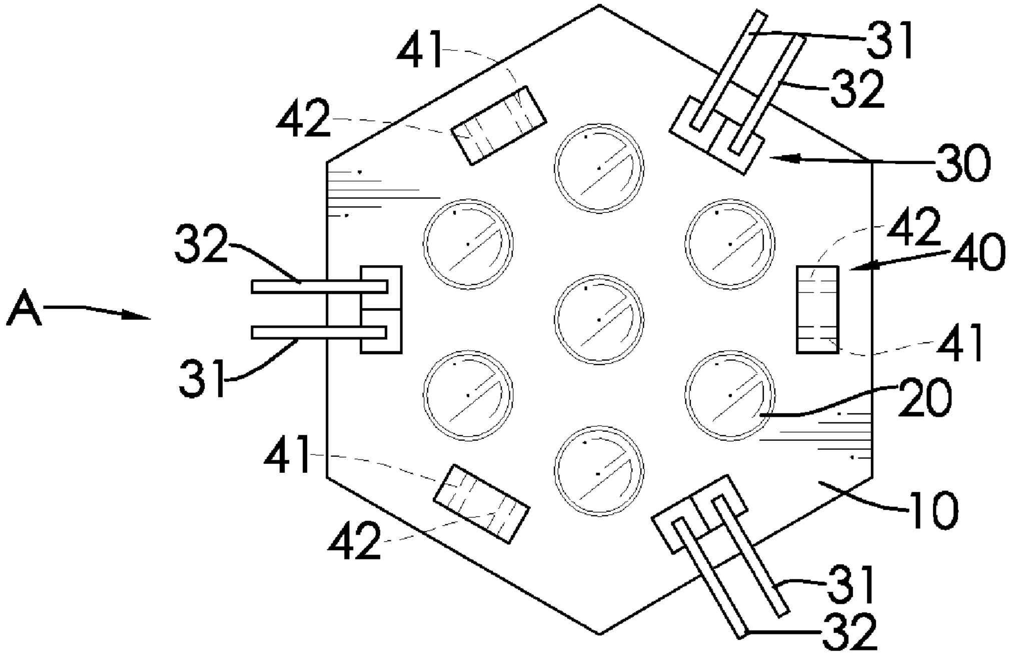
FIG. 1 is a top view of a first embodiment of a light emitting diode (LED) module in accordance with the present invention.
Figure 2:
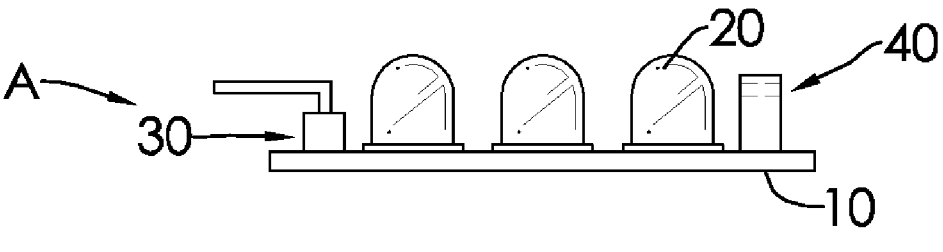
FIG. 2 is a side view of the LED module in FIG. 1.

With reference to FIGS. 1 and 2, a first embodiment of a light emitting diode (LED) module A in accordance with the present invention comprises a substrate 10 and at least one LED 20.

The substrate 10 is hexagonal, may be a printed circuit board, an aluminum substrate or the like and has a circuit, six edges, three terminal sets 30 and three sockets 40. The circuit is formed on the substrate 10.

The terminal sets 30 and the sockets 40 are arranged alternately on the substrate 10, respectively correspond to the edges of the substrate 10 and are connected electrically to the circuit. Each terminal set 30 has a positive terminal 31 and a negative terminal 32. Each socket 40 has a positive jack 41 and a negative jack 42. The adjacent jack and terminal on adjacent socket 40 and terminal set 30 have the same electrode. For example, the positive jack 41 is adjacent to the positive terminal 31 of an adjacent terminal set 30. The negative jack 42 is adjacent to the negative terminal 32 of another adjacent terminal set 30.

The at least one LED 20 is mounted on the substrate 10 and is connected electrically to the circuit of the substrate 10. In the first embodiment of the present invention, the LED module A has seven LEDs 20 mounted on the substrate 10.

Figure 3:
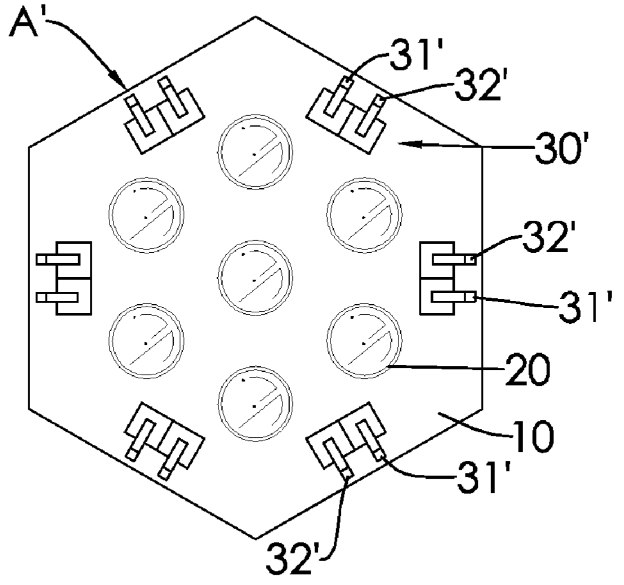
FIG. 3 is a top view of a second embodiment of an LED module in accordance with the present invention.
Figure 4:
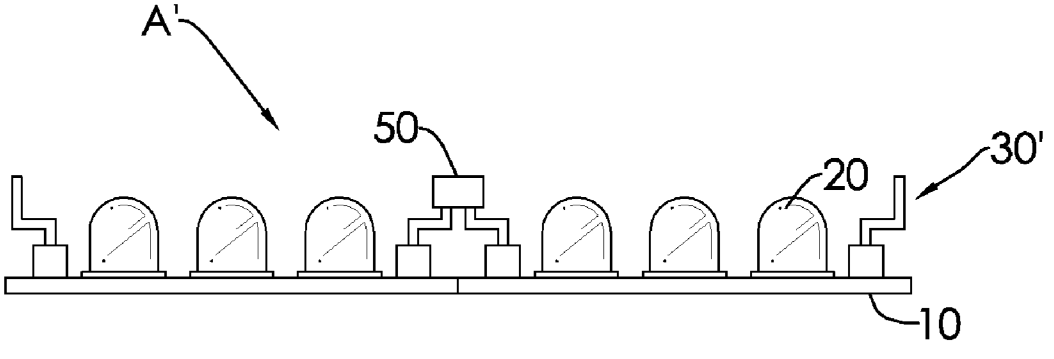
FIG. 4 is a side view of the LED module in FIG. 3.

With reference to FIGS. 3 and 4, a second embodiment of an LED module A' in accordance with the present invention comprises a substrate 10 and at least one LED 20.

The substrate 10 is hexagonal, may be a printed circuit board, an aluminum substrate or the like and has a circuit, six edges and six terminal sets 30'. The circuit is formed on the substrate 10.

The terminal sets 30' are mounted on the substrate 10, are connected electrically to the circuit and respectively correspond to the edges of the substrate 10. Each terminal set 30' has a positive terminal 31' and a negative terminal 32'. The adjacent terminals on adjacent terminal sets 30' have the same electrode. For example, the positive terminal 31' is adjacent to the positive terminal 31' of an adjacent terminal set 30'. The negative terminal 32' is adjacent to the negative terminal 32' of another adjacent terminal set 30'.

The at least one LED 20 is mounted on the substrate 10 and is connected electrically to the circuit of the substrate 10.

Figure 5:
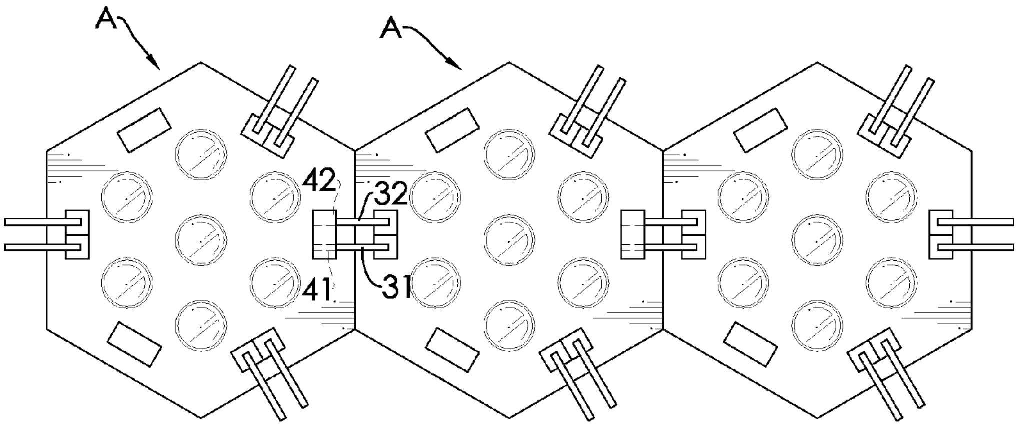
FIG. 5 is a first operational top view of the LED modules in FIG. 1.

With further reference to FIG. 5, the positive and negative terminals 31, 32 of one terminal set 30 of one LED module A are plugged respectively to the positive and negative jacks 41, 42 of one socket 40 of the other LED module A. Thus, the LED modules A are connected electrically to each other. Relative positions of the positive and negative terminals 31, 32 of the terminal set 30 and the positive and negative jacks 41, 42 of the socket 40 allow the terminals 31, 32 of each terminal set 30 of one LED module A to be plugged to corresponding jacks 41, 42 of each socket 40 of the other LED module A.

Figure 8:
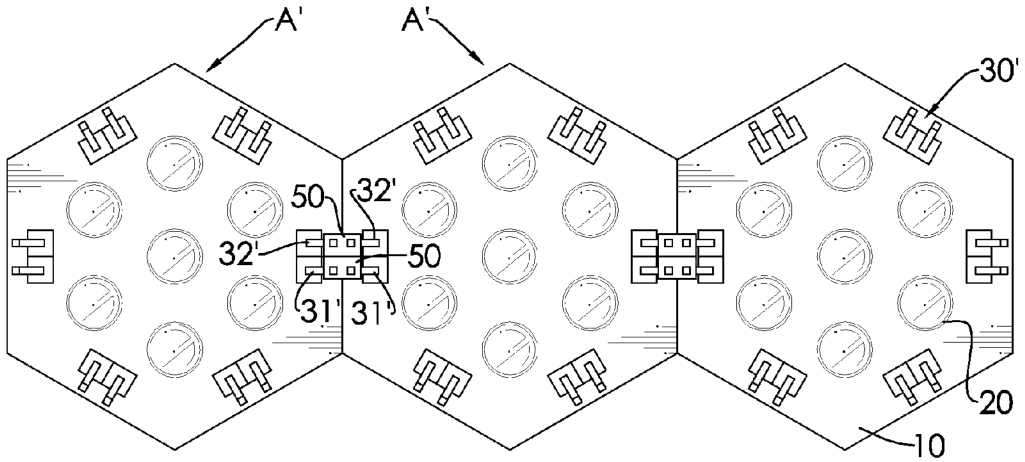
FIG. 8 is a first operational top view of the LED modules in FIG. 3.

With further reference to FIGS. 4 and 8, two connectors 50 respectively connect the positive terminal 31' of one terminal set 30' of one LED module A' to the positive terminal 31' of one terminal set 30' of the other LED module A' and the negative terminal 32' of one terminal set 30' of one LED module A' to the negative terminal 32' of one terminal set 30' of the other LED module A'. Thus, the LED modules A' are connected electrically to each other. Relative positions of the positive and negative terminals 31', 32' of the terminal set 30' allow the terminals 31', 32' of each terminal set 30' of one LED module A' to be connected to the terminals 31', 32' of each terminal set 30' of the other LED module A' through the connectors 50.

Figure 6:
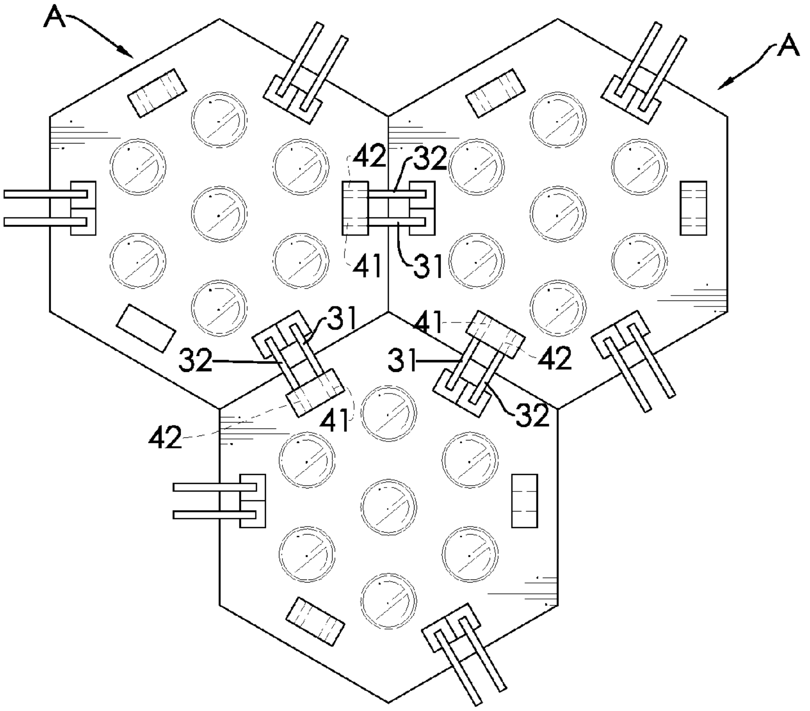
FIG. 6 is a second operational top view of the LED modules in FIG. 1.
Figure 7:
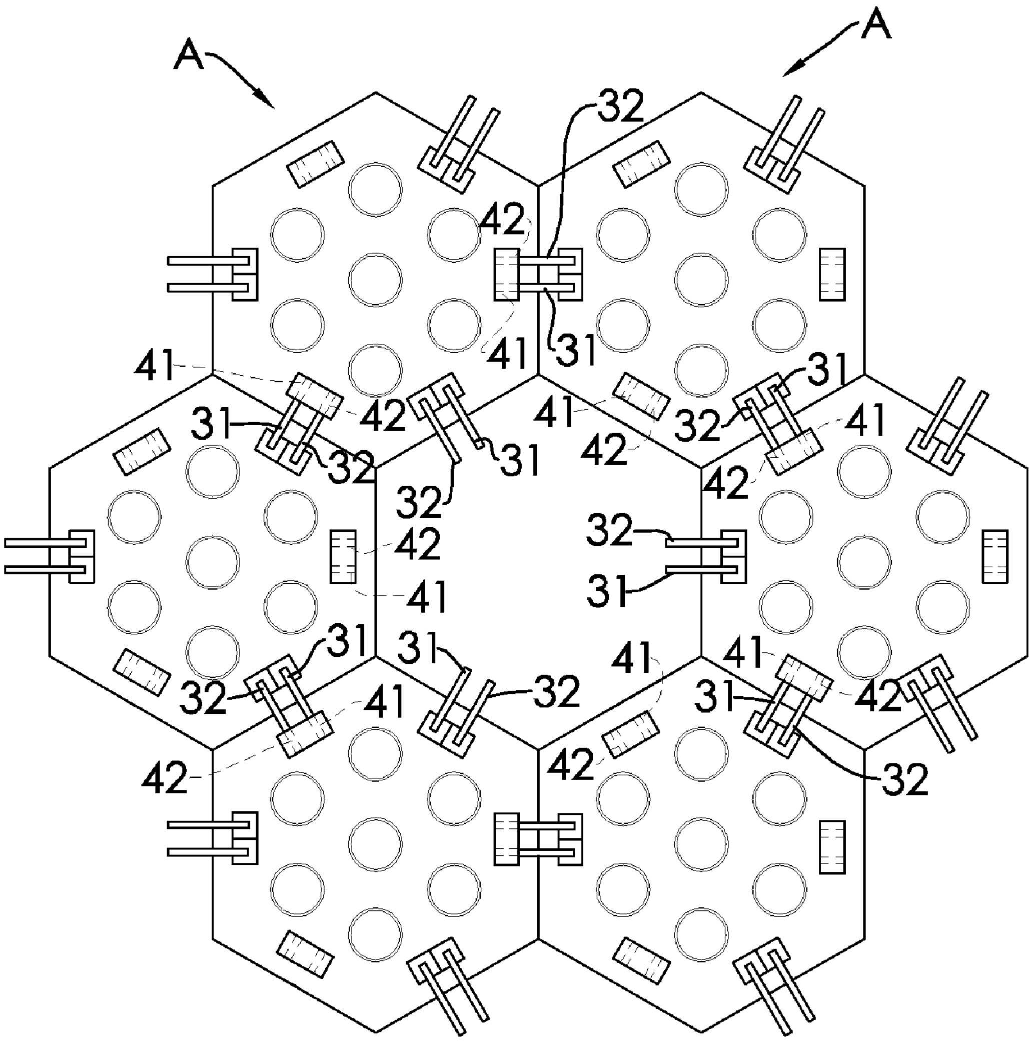
FIG. 7 is a third operational top view of the LED modules in FIG. 1.
Figure 9:
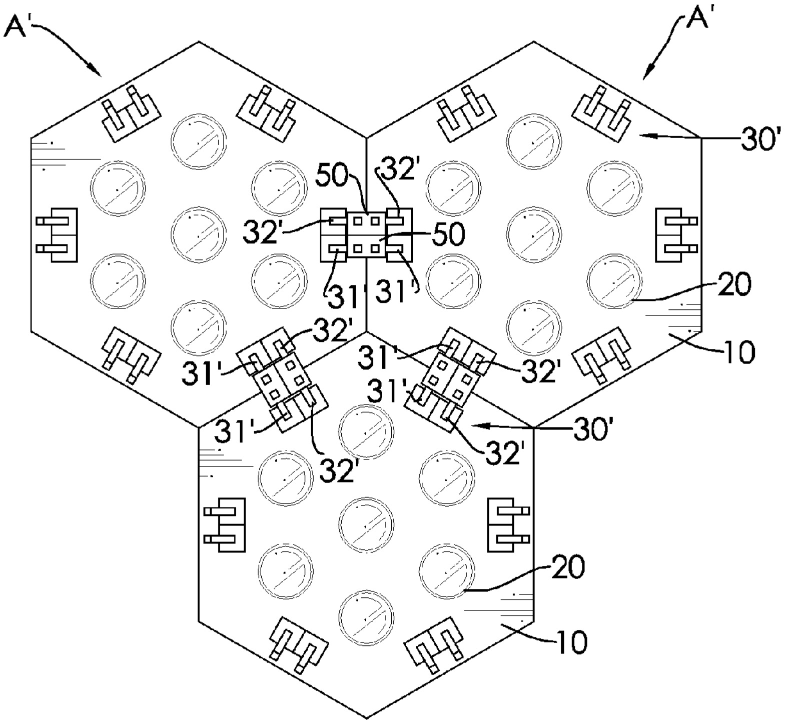
FIG. 9 is a second operational top view of the LED modules in FIG. 3.

Since the substrate 10 of the LED module A, A' are hexagonal, the edges of one LED module A, A' are able to correspond to the edges of the other LED modules A, A'. Therefore, the LED modules A, A' are assembled to form many different patterns according to variable products. With reference to FIGS. 5 and 8, the LED modules A, A' may be arranged in a row. With further reference to FIGS. 6 and 9, the LED modules A, A' may be arranged in a substantially triangular form. Furthermore, with further reference to FIG. 7, the LED module A' may also be arranged in a substantially circular form.

The LED module A, A' as described has the following advantages. Since the LED modules A, A' are assembled together by plugging the terminal set 30 of one LED module A to the socket 40 of the other LED module A, or by mounting the connectors 50 on the terminal set 30' of two LED modules A', when the an LED 20 of a module A, A' breaks, only the LED module A, A' needs to be replaced, which is easy, low cost and saves resources.

Moreover, since the LED modules A, A' are connected in parallel, no matter how many LED modules A, A' are connected to one another, a kind of power supply system is sufficient for all kinds of combinations of the LED modules A, A'.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A light emitting diode (LED) module comprising
a substrate being hexagonal and having
a circuit formed on the substrate;
six edges;
three terminal sets and three sockets arranged alternately on the substrate, respectively corresponding to the edges of the substrate and connected electrically to the circuit, and each terminal set having a positive terminal and a negative terminal, each socket having a positive jack and a negative jack; and
at least one LED mounted on the substrate and connected electrically to the circuit of the substrate;
wherein adjacent jack and terminal on adjacent socket and terminal set have the same electrode.

2. The LED module as claimed in claim 1, wherein the substrate is a printed circuit board.

3. The LED module as claimed in claim 1, wherein the substrate is an aluminum substrate.

4. An LED module comprising
a substrate being hexagonal and having
a circuit formed on the substrate;
six edges; and
six terminal sets mounted on the substrate, connected electrically to the circuit and respectively corresponding to the edges of the substrate, and each terminal set having a positive terminal and a negative terminal, and adjacent terminals on adjacent terminal sets having the same electrode; and
at least one LED mounted on the substrate and connected electrically to the circuit of the substrate.

5. The LED module as claimed in claim 4, wherein the substrate is a printed circuit board.

6. The LED module as claimed in claim 4, wherein the substrate is an aluminum substrate.

* * * * *